US010235259B2

(12) United States Patent
Chen et al.

(10) Patent No.: US 10,235,259 B2
(45) Date of Patent: Mar. 19, 2019

(54) MEMORY OVERCLOCKING METHOD AND COMPUTER DEVICE

(71) Applicant: GIGA-BYTE TECHNOLOGY CO., LTD., New Taipei (TW)

(72) Inventors: Cho-May Chen, New Taipei (TW); Hou-Yuan Lin, New Taipei (TW); Sheng-Liang Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 97 days.

(21) Appl. No.: 15/481,478

(22) Filed: Apr. 7, 2017

(65) Prior Publication Data

US 2018/0188769 A1 Jul. 5, 2018

(30) Foreign Application Priority Data

Dec. 30, 2016 (TW) .............................. 105144018 A

(51) Int. Cl.
*G11C 7/22* (2006.01)
*G06F 11/24* (2006.01)
*G06F 9/4401* (2018.01)

(52) U.S. Cl.
CPC ............ *G06F 11/24* (2013.01); *G06F 9/4401* (2013.01); *G11C 7/222* (2013.01)

(58) Field of Classification Search
CPC ..... G06F 1/08; G06F 1/10; G06F 1/14; G06F 1/26; G06F 1/3203; G06F 1/324; G06F 11/24; G11C 7/222
See application file for complete search history.

(56) References Cited

U.S. PATENT DOCUMENTS

| 7,012,956 B1 * | 3/2006 | Thomsen ............... G11C 29/02 375/224 |
| 8,006,062 B1 * | 8/2011 | Cheng ................... G06F 9/4401 711/104 |

(Continued)

FOREIGN PATENT DOCUMENTS

| TW | 522298 | 3/2003 |
| TW | 200915343 | 4/2009 |
| TW | 201022880 | 6/2010 |

OTHER PUBLICATIONS

"Office Action of Taiwan Counterpart Application," dated May 16, 2017, p. 1-p. 6, in which the listed references were cited.

*Primary Examiner* — Austin Hicks
(74) *Attorney, Agent, or Firm* — JCIPRNET

(57) ABSTRACT

A memory overclocking method adapted for a computer device is provided. The computer device includes a basic input output system and a memory. The memory overclocking method includes the following steps. A boot loader of the computer device is executed, and an overclocking module is executed by the basic input output system, wherein a first memory clock frequency for overclocking is preset in a serial presence detect of a memory. A second memory clock frequency by the overclocking module is generated by the overclocking module, wherein the second memory clock frequency is higher than the first memory clock frequency. Whether the second memory clock frequency meets a boot condition of the computer device is determined to decide whether to operate the memory at the second memory clock frequency. In addition, a computer device applying the memory overclocking method is also provided.

10 Claims, 4 Drawing Sheets

(56) References Cited

U.S. PATENT DOCUMENTS

| | | | | |
|---|---|---|---|---|
| 2008/0215876 A1* | 9/2008 | Lee | ............................ | G06F 1/24 |
| | | | | 713/100 |
| 2010/0100720 A1* | 4/2010 | Wu | ...................... | G06F 11/1417 |
| | | | | 713/2 |
| 2013/0151883 A1* | 6/2013 | Winbom | .............. | H04L 12/6418 |
| | | | | 713/500 |

* cited by examiner

MEMORY OVERCLOCKING METHOD AND COMPUTER DEVICE

CROSS-REFERENCE TO RELATED APPLICATION

This application claims the priority benefit of Taiwan application serial no. 105144018, filed on Dec. 30, 2016. The entirety of the above-mentioned patent application is hereby incorporated by reference herein and made a part of this specification.

BACKGROUND OF THE INVENTION

Field of the Invention

The invention relates to an overclocking technology and particularly relates to a memory overclocking method and a computer device thereof.

Description of Related Art

In the technical field of computer devices, a memory is an essential and indispensable component in a computer device. Under normal circumstances, when a user desires to achieve better work efficiency on their existing computer device, they usually increase a data access speed by memory overclocking. Moreover, configuration information of a memory is generally preset in a serial presence detect (SPD) of the memory. When the computer device boots, a basic input output system (BIOS) configures relevant operation parameters of the memory by the information in the serial presence detect. However, in the serial presence detect of the memory, two pairs of overclocking parameter records are generally recorded, so that the memory can be operated with preset overclocking parameters after booting of the computer. Still, since a preset overclocking frequency may not satisfy the user's needs, if the user wishes to achieve better processing efficiency on the computer device, they have to make adjustments manually. Thus, it has become an important issue to automatically overclock a clock frequency of the memory so as to enable the computer device to automatically and efficiently operate at a faster processing speed.

SUMMARY OF THE INVENTION

The invention provides a memory overclocking method and a computer device, enabling a memory to, after booting, automatically determine whether to be operated at another overclocking frequency higher than a preset overclocking frequency, so as to effectively increase an operation speed of the memory.

The memory overclocking method of the invention is suitable for a computer device including a basic input output system and a memory. The memory overclocking method includes the following steps. A boot loader of the computer device is executed, and an overclocking module is executed by the basic input output system, wherein a first memory clock frequency for overclocking is preset in a serial presence detect of the memory. A second memory clock frequency is generated by the overclocking module, wherein the second memory clock frequency is higher than the first memory clock frequency. Whether the second memory clock frequency meets a boot condition of the computer device is determined to decide to operate the memory at the second memory clock frequency.

In an embodiment of the invention, the step of generating the second memory clock frequency by the overclocking module includes the following step. From a plurality of reference clock frequencies pre-stored in a parameter database, one of the reference clock frequencies corresponding to specifications of the memory is selected as the second memory clock frequency.

In an embodiment of the invention, the step of generating the second memory clock frequency by the overclocking module includes the following step. The second memory clock frequency is calculated by the overclocking module according to at least one of an operating voltage, a RAS-to-CAS delay, a column address strobe latency, and a slew rate of the memory.

In an embodiment of the invention, the step of determining whether the second memory clock frequency meets the boot condition of the computer device includes the following step. Whether the computer device is successfully booted and an operation system of the computer device is activated is determined.

In an embodiment of the invention, the step of determining whether the second memory clock frequency meets the boot condition of the computer device includes the following step. An eye pattern of the memory is analyzed and whether the second memory clock frequency module is suitable for running the memory is verified.

In an embodiment of the invention, the memory overclocking method further includes the following step. When the second memory clock frequency fails to meet the boot condition of the computer device, execution of the overclocking module is stopped, and the memory is operated at a standard memory clock frequency, wherein the standard memory clock frequency is preset in the serial presence detect of the memory, and the standard memory clock frequency is lower than the first memory clock frequency.

The computer device of the invention includes a storage device, a basic input output system and a memory. A processor is coupled to the basic input output system. When a boot loader is executed, the processor executes the basic input output system. The memory is coupled to the processor, and a first memory clock frequency for overclocking is preset in a serial presence detect of the memory. When the boot loader is executed, the basic input output system executes the overclocking module to generate a second memory clock frequency higher than the first memory clock frequency. The basic input output system determines whether the second memory clock frequency meets a boot condition to decide to operate the memory at the second memory clock frequency.

In an embodiment of the invention, the overclocking module selects, from a plurality of reference clock frequencies pre-stored in a parameter database, one of the reference clock frequencies corresponding to specifications of the memory as the second memory clock frequency.

In an embodiment of the invention, the overclocking module calculates the second memory clock frequency according to at least one of an operating voltage, a RAS-to-CAS delay, a column address strobe latency, and a slew rate of the memory.

In an embodiment of the invention, the boot condition is to determine whether the computer device is successfully booted and an operation system of the computer device is activated.

In an embodiment of the invention, the boot condition is that the basic input output system analyzes an eye pattern of the memory, and verifies whether the second memory clock frequency is suitable for the computer device to execute the boot loader.

In an embodiment of the invention, when the second memory clock frequency fails to meet the boot condition, the basic input output system stops executing the overclocking module, and operates the memory at a standard memory clock frequency. The standard memory clock frequency is preset in the serial presence detect of the memory, and the standard memory clock frequency is lower than the first memory clock frequency.

Based on the above, the memory overclocking method and the computer device of the invention automatically determine whether the memory can be operated at the overclocking frequency higher than the preset overclocking frequency, so that the computer device has a faster processing speed after booting.

To make the aforementioned and other features and advantages of the invention more comprehensible, several embodiments accompanied with drawings are described in detail as follows.

DESCRIPTION OF THE EMBODIMENTS

Several embodiments are provided below to illustrate the invention, but the invention is not limited to the given several embodiments. Further, appropriate combinations are also allowed between the embodiments. The term "coupled" used throughout the specification (including the claims) of the present application refers to any direct or indirect connecting means. For instance, if it is described that a first device is coupled to a second device, it should be interpreted that the first device may be directly connected to the second device, or the first device may be indirectly connected to the second device by other devices or a certain connecting means.

Figure 1:
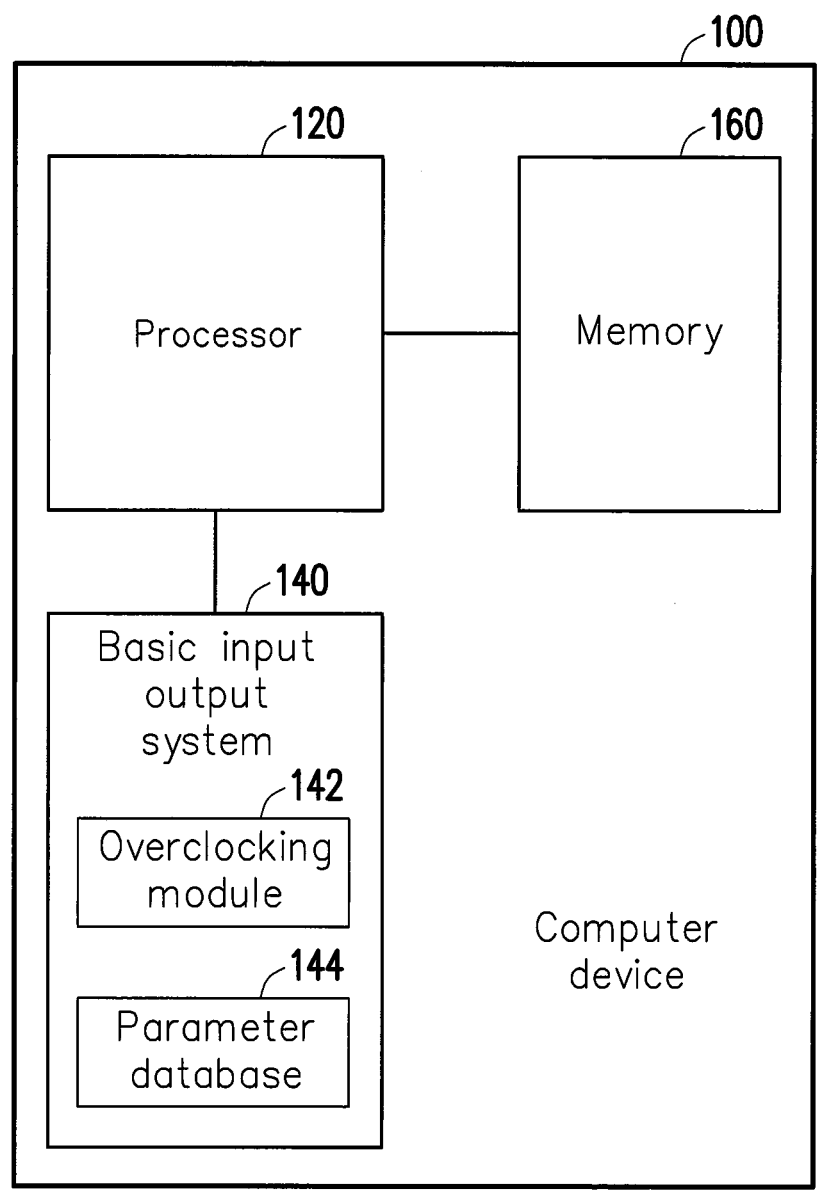
FIG. 1 shows a schematic view of a computer device according to an embodiment of the invention.

FIG. 1 shows a schematic view of a computer device according to an embodiment of the invention. Referring to FIG. 1, a computer device 100 includes a processor 120, a basic input output system (BIOS) 140, and a memory 160. In this embodiment, the computer device 100 is applied to a computer operating system, and the processor 120 and the memory 160 are disposed in the computer device 100 through a mainboard having a CPU socket and a memory socket. In this embodiment, the processor 120 is coupled to the basic input output system 140 and the memory 160. In this embodiment, the basic input output system 140 is used to execute an overclocking module 142 and a parameter database 144. The basic input output system 140 has a function of setting a memory clock frequency of the memory 160.

In this embodiment, when the computer device 100 executes a boot loader, according to relevant memory specification information preset in a serial presence detect (SPD) of the memory 160, e.g., type, clock frequency or operating voltage of the memory and so on, which is not limited in the invention, the computer device 100 determines, by the basic input output system 140, whether the memory 160 is suitable for being operated at another overclocking frequency higher than a first memory clock frequency preset based on an extreme memory profile (XMP). When the basic input output system 140 determines that the memory 160 is suitable for being operated at another higher overclocking frequency, the basic input output system 140 of this embodiment executes the overclocking module 142 to generate an overclocking frequency higher than the memory clock frequency preset in the serial presence detect (SPD) of the memory 160 as a memory clock frequency.

Specifically, a standard memory clock frequency and the first memory clock frequency are preset in the serial presence detect of the memory 160. Both the standard memory clock frequency and the first memory clock frequency are memory operating speeds in default settings, and the first memory clock frequency is set according to the extreme memory profile. That is to say, the overclocking module 142 of this embodiment further calculates a second memory clock frequency higher than the first memory clock frequency, so as to operate the memory 160 at the second memory clock frequency after the computer device 100 boots.

In this embodiment, the computer device 100 may be a device having operation functions, such as a personal computer, a notebook computer, a tablet computer, and so on. The computer device 100 has a mainboard with the processor 120, the basic input output system 140, and the memory 160 thereon. In this embodiment, the processor 120 is a central processing unit (CPU). The basic input output system 140 may be stored in a storage device, wherein the storage device is a flash memory, and the storage device stores both the overclocking module 142 and the parameter database 144. In this embodiment, the overclocking module 142 and the parameter database 144 are realized as software. That is to say, the overclocking module 142 and the parameter database 144 may be firmware embedded in the computer device 100, similarly to the basic input output system 140. In an embodiment, the overclocking module 142 and the parameter database 144 may also be stored in another storage device. In this embodiment, the overclocking module 142 is used to generate the second memory clock frequency by executing an algorithm to realize a calculation of a clock frequency. Alternatively, in an embodiment, the overclocking module 142 may also execute a read command to read a reference clock frequency pre-stored in the parameter database 144 as the second memory clock frequency, and the invention is not limited thereto.

In this embodiment, the memory 160 is a dynamic random access memory (DRAM), e.g., a synchronous dynamic random-access memory (SDRAM), a double-data-rate two synchronous dynamic random-access memory (DDR2 SDRAM), a double-data-rate three synchronous dynamic random-access memory (DDR3 SDRAM), or a double-data-rate fourth synchronous dynamic random-access memory (DDR4 SDRAM), and the invention is not limited thereto.

Figure 2:
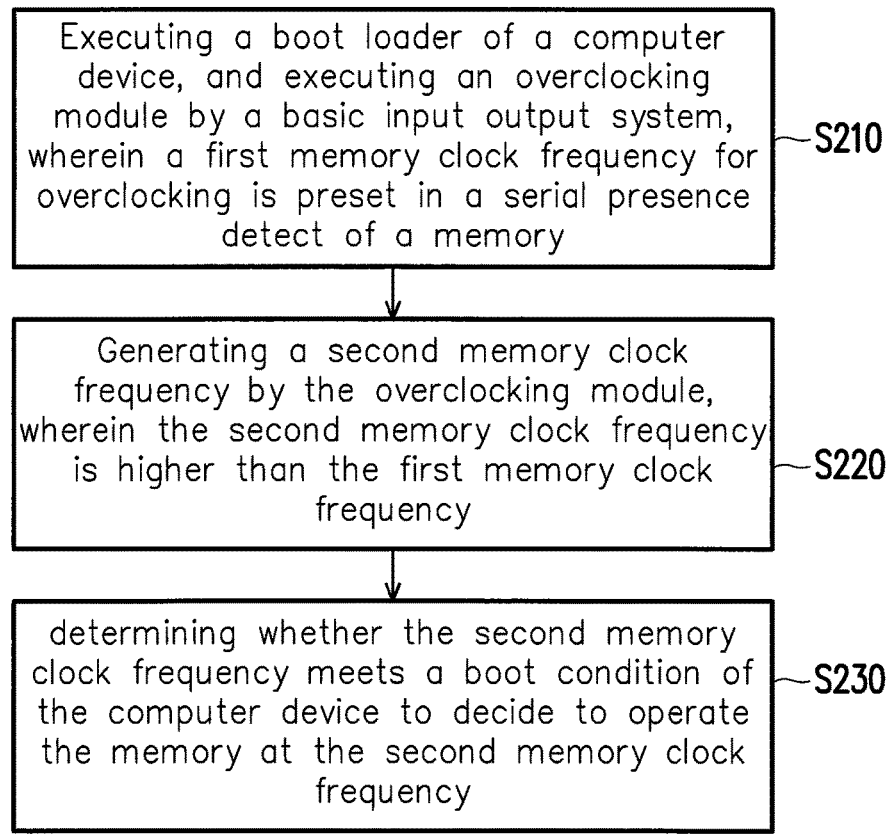
FIG. 2 shows a flowchart of steps of a memory overclocking method according to an embodiment of the invention.

FIG. 2 shows a flowchart of steps of a memory overclocking method according to an embodiment of the invention. Referring to FIGS. 1 and 2, the memory overclocking method of this embodiment may be applied to at least the computer device 100 of FIG. 1. The memory overclocking method of this embodiment includes the following steps. First, in step S210, the processor 120 executes the boot loader of the computer device 100, and executes the overclocking module 142 by the basic input output system 140. Then, in step S220, the overclocking module 142 generates the second memory clock frequency, and the second memory clock frequency is higher than the first memory clock frequency preset in the serial presence detect of the memory 160. Then, in step S230, the basic input output system 140 determines whether the second memory clock frequency meets a boot condition of the computer device 100 to decide to operate the memory 160 at the second memory clock frequency. Thus, by executing the overclocking module 142, the basic input output system 140 of this embodiment generates another overclocking frequency higher than the first memory clock frequency preset in the memory 160, so as to operate the memory 160 at a faster operating speed.

Figure 3:
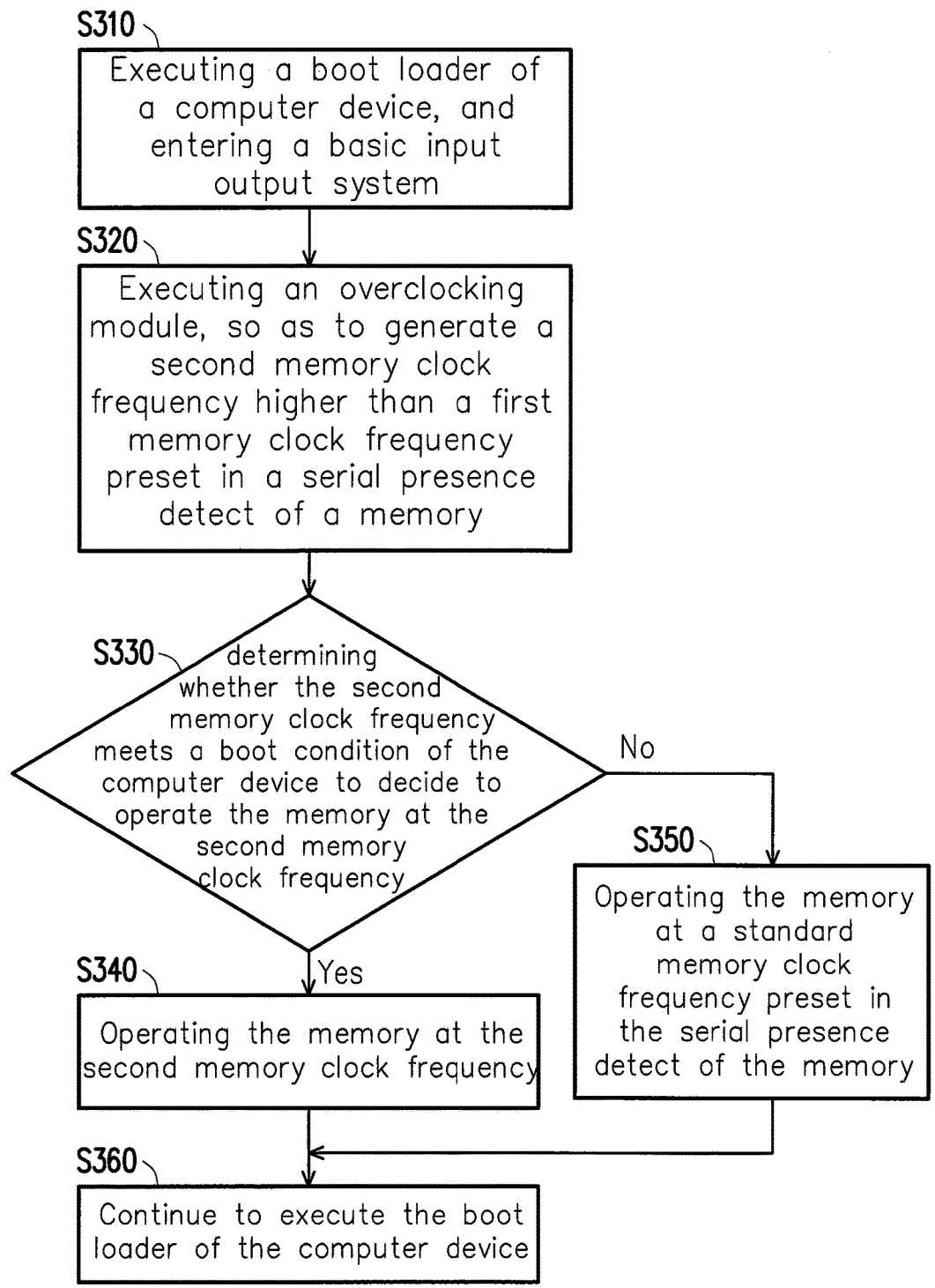
FIG. 3 shows a flowchart of steps of the memory overclocking method according to another embodiment of the invention.

To make people of ordinary skill in the art understand the memory overclocking method of the invention, another embodiment is described as below. FIG. 3 shows a flowchart of steps of a memory overclocking method according to another embodiment of the invention. Referring to FIGS. 1 and 3, the memory overclocking method of this embodiment may be applied to at least the computer device 100 of FIG. 1. In step S310, the processor 120 executes the boot loader of the computer device 100, and enters the basic input output system 140. Then, in step S320, the basic input output system 140 executes the overclocking module 142 to generate the second memory clock frequency higher than the first memory clock frequency preset in the serial presence detect of the memory 160. It should be noted that, in this embodiment, the overclocking module 142 and the parameter database 144 are additionally written and pre-stored in the storage device. The overclocking module 142 is used to execute an algorithm operation to generate the second memory clock frequency, or is used to read the reference clock frequency in the parameter database corresponding to the specifications of the memory 160 as the second memory clock frequency, but the invention is not limited thereto. In an embodiment, the overclocking module 142 may also be used to calculate or estimate the second memory cock frequency according to at least one of an operating voltage, a RAS-to-CAS delay (tRCD), a column address strobe latency (CAS Latency) and a slew rate of the memory 160.

For instance, the memory 160 is, for example, a DDR4 SDRAM. The standard memory clock frequency and two first memory clock frequencies for overclocking in a profile preset based on the extreme memory profile are preset in the serial presence detect of the memory 160, wherein the standard memory clock frequency is 2133 MHz, and the two first memory clock frequencies are 2400 MHz and 2600 MHz respectively. In this embodiment, when the computer device 100 enters the basic input output system 140 after booting, the basic input output system 140 executes the overclocking module 142, wherein the storage device further includes the parameter database 144 for storing data of a plurality of reference clock frequencies. According to the specifications of the memory 160, the overclocking module 142 searches in the parameter database 144 for a corresponding reference clock frequency as the second memory clock frequency. The plurality of reference clock frequencies in the parameter database 144 were obtained by a mainboard manufacturer by pre-testing all kinds of memory and have been previously written. However, in an embodiment, if the parameter database 144 does not have the reference clock frequency corresponding to the specifications of the memory 160, the overclocking module 142 may calculate or estimate the second memory clock frequency according to at least one of the operating voltage, the RAS-to-CAS delay (tRCD), the column address strobe latency (CAS Latency) and the slew rate of the memory 160. Further, the second memory clock frequency may be, for example, 3000 MHz. The second memory clock frequency is higher than the preset standard memory clock frequency and first memory clock frequency for overclocking, but the invention is not limited thereto. The second memory clock frequency is determined according to different specifications of the memory 160 and device conditions of the computer device 100.

Then, in step S330, the basic input output system 140 determines whether the second memory clock frequency meets the boot condition of the computer device 100 to decide whether to operate the memory 160 at the second memory clock frequency. In this embodiment, the boot condition of the computer device 100 is that the basic input output system 140 determines whether an operation system (OS) of the computer device 100 is successfully booted. That is, in step S340, if the second memory clock frequency provided by the overclocking module 142 successfully boots the computer device 100 and enables the computer device 100 to normally log in to the operation system, the computer device 100 continues to execute the boot loader and operates the memory 160 at the second memory clock frequency. By contrast, if the second memory clock frequency provided by the overclocking module 142 fails to successfully boot the computer device 100 or fails to enable the computer device 100 to log in to the operation system, it means that the memory 160 cannot be operated at this clock frequency. Thus, in step S350, the basic input output system 140 resets the setting of the memory clock frequency to the preset standard memory clock frequency or the first memory clock frequency for overclocking, so as to successfully boot the computer device 100. Finally, in step S360, the basic input output system 140 continues to execute the boot loader of the computer device 100. By the way, in this embodiment, the situation that the computer device is successfully booted is that the computer device 100 operate stably, and the operating system is activated, so that users can manipulate it, and a system crash or a damage to other computer devices are prevented from occurring.

Figure 4:
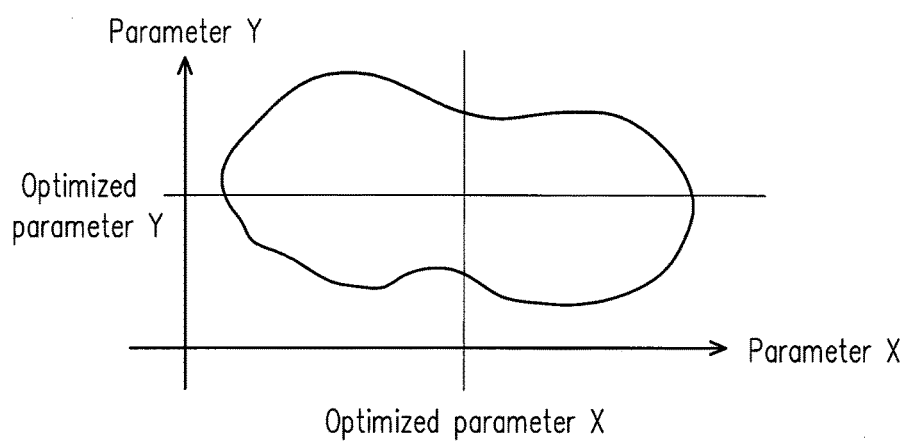
FIG. 4 shows a schematic view of an analysis of an eye pattern of a memory according to an embodiment of the invention.

However, in an embodiment, the boot condition of the computer device 100 may be, for example, to analyze an eye pattern of the memory 160, so as to verify whether the second memory clock frequency is suitable for the computer device 100 to execute the boot loader. FIG. 4 shows a schematic view of analysis of an eye pattern of a memory of according to an embodiment of the invention. Referring to FIG. 4, the basic input output system 140 operates an eye pattern of the second memory clock frequency provided at the overclocking module 142 by simulating the memory 160. For instance, an X axis and a Y axis of the eye pattern of FIG. 4 represent time and voltage respectively. The basic input output system 140 determines whether the memory 160 can be successfully operated at the second memory clock frequency according to an eye pattern formed by an optimized parameter X and an optimized parameter Y corresponding to the second memory clock frequency in a signal waveform. For example, the basic input output system 140 determines, according to whether values of the eye pattern on the X axis and the Y axis are respectively greater than a preset first threshold and a preset second threshold, whether the memory 160 operates stably. That is to say, the basic input output system 140 of this embodiment automatically determines whether the memory 160 can be operated at an overclocking frequency higher than a preset frequency.

If the memory 160 cannot be operated at the overclocking frequency higher than the preset frequency, the basic input output system 140 resets the setting of the memory clock frequency to re-operate the memory 160 at the preset standard memory clock frequency or the first memory clock frequency for overclocking, so as to successfully boot the computer device 100. Accordingly, the computer device 100 of this embodiment performs overclocking efficiently and executes the boot loader stably.

To sum up, in the memory overclocking method and the computer device of the invention, according to the relevant memory specification information preset in the serial presence detect of the memory, whether the memory is suitable for being operated at another overclocking frequency higher than the first memory clock frequency preset based on the extreme memory profile is determined by the basic input output system. When the memory is suitable for being operated at another higher overclocking frequency, the basic input output system executes the overclocking module to generate the second memory clock frequency higher than the preset first memory clock frequency for overclocking. In addition, by determining whether the second memory clock frequency meets the boot condition of the computer device, whether to operate the memory at the second memory clock frequency is decided. Further, the overclocking module may generate the second memory clock frequency by using the reference clock frequency corresponding to the specifications of the memory preset in the parameter database as the second memory clock frequency or by determining the second memory clock frequency by a timing parameter or the operating voltage of the memory. Accordingly, the memory overclocking method and the computer device of the invention automatically perform memory overclocking efficiently.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A memory overclocking method, suitable for a computer device comprising a basic input output system and a memory, wherein the method comprises:
  when the computer device is booted, automatically executing a boot loader of the computer device, and automatically executing an overclocking module by the basic input output system, wherein at least one first memory clock frequency for overclocking is preset in a serial presence detect of the memory;
  generating a second memory clock frequency by the overclocking module, wherein the second memory clock frequency is higher than the at least one first memory clock frequency and the second memory clock frequency is a function of a slew rate of the memory;
  analyzing an eye pattern of the memory to determine an optimal slew rate for the memory and an optimal second memory clock frequency as a function of the optimized slew rate of the memory; and
  determining whether the second memory clock frequency is the optimal second memory clock frequency of the computer device, and operating the memory at the second memory clock frequency if the second memory clock frequency is the optimal second memory clock frequency.

2. The memory overclocking method according to claim 1, wherein the step of generating the second memory clock frequency by the overclocking module comprises:
  selecting one of the reference clock frequencies corresponding to specifications of the memory as the second memory clock frequency from a plurality of reference clock frequencies pre-stored in a parameter database.

3. The memory overclocking method according to claim 1, wherein the step of generating the second memory clock frequency by the overclocking module comprises:
  calculating the second memory clock frequency by the overclocking module according to the slew rate of the memory and at least one of an operating voltage, a RAS-to-CAS delay and a column address strobe latency of the memory.

4. The memory overclocking method according to claim 1, wherein the step of determining whether the second memory clock frequency meets the boot condition of the computer device comprises:
  determining whether the computer device is successfully booted and an operation system of the computer device is activated.

5. The memory overclocking method according to claim 1, further comprising:
  when the second memory clock frequency fails to meet the boot condition of the computer device, stopping executing the overclocking module, and operating the memory at a standard memory clock frequency, wherein the standard memory clock frequency is preset in the serial presence detect of the memory, and the standard memory clock frequency is lower than the at least one first memory clock frequency.

6. A computer device, comprising:
  a basic input output system;
  a processor, coupled to the basic input output system, wherein when a boot loader is executed, the processor executes the basic input output system; and
  a memory, coupled to the processor, wherein at least one first memory clock frequency for overclocking is preset in a serial presence detect of the memory,
  wherein when the computer device is booted, the boot loader is automatically executed, and the basic input output system automatically executes an overclocking module to generate a second memory clock frequency higher than the at least one first memory clock frequency and the second memory clock frequency is a function of a slew rate of the memory,
  wherein the basic input output system analyzes an eye pattern of the memory to determine an optimal slew rate for the memory and an optimal second memory clock frequency as a function of the optimized slew rate of the memory,
  wherein the basic input output system determines whether the second memory clock frequency is the optimal second memory clock frequency of the computer device and operates the memory at the second memory clock frequency if the second memory clock frequency is the optimal second memory clock frequency.

7. The computer device according to claim 6, wherein the overclocking module selects one of the reference clock frequencies corresponding to specifications of the memory as the second memory clock frequency from a plurality of reference clock frequencies pre-stored in a parameter database.

8. The computer device according to claim 6, wherein the overclocking module calculates the second memory clock frequency according to the slew rate of the memory and at least one of an operating voltage, a RAS-to-CAS delay and a column address strobe latency of the memory.

9. The computer device according to claim 6, wherein the boot condition is to determine whether the computer device is successfully booted and an operation system of the computer device is activated.

10. The computer device according to claim 6, wherein when the second memory clock frequency fails to meet the boot condition, the basic input output system stops executing the overclocking module, and operates the memory at a standard memory clock frequency, wherein the standard memory clock frequency is preset in the serial presence detect of the memory, and the standard memory clock frequency is lower than the at least one first memory clock frequency.

* * * * *